United States Patent
Tsao et al.

(10) Patent No.: US 9,252,296 B2
(45) Date of Patent: *Feb. 2, 2016

(54) SEMICONDUCTOR DEVICE WITH COMPRESSIVE LAYERS

(71) Applicant: TAIWAN SEMICONDUCTOR MANUFACTURING COMPANY, LTD., Hsinchu (TW)

(72) Inventors: Chun-Han Tsao, New Taipei (TW); Chih-Yu Lai, Tainan (TW); Chih-Hui Huang, Yongkang (TW); Cheng-Ta Wu, Shueishang Township (TW); Yeur-Luen Tu, Taichung (TW); Ching-Chun Wang, Tainan (TW); Shyh-Fann Ting, Kaohsiung (TW); Chia-Shiung Tsai, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/713,559

(22) Filed: May 15, 2015

(65) Prior Publication Data

US 2015/0263055 A1    Sep. 17, 2015

Related U.S. Application Data

(63) Continuation of application No. 13/492,258, filed on Jun. 8, 2012, now Pat. No. 9,059,057.

(51) Int. Cl.
*H01L 31/102*      (2006.01)
*H01L 21/00*       (2006.01)
*H01L 31/0216*     (2014.01)
*H01L 51/42*       (2006.01)
*H01L 27/146*      (2006.01)
*H01L 27/148*      (2006.01)

(52) U.S. Cl.
CPC ...... *H01L 31/02164* (2013.01); *H01L 27/1464* (2013.01); *H01L 27/14623* (2013.01); *H01L 27/14632* (2013.01); *H01L 27/14687* (2013.01); *H01L 51/4273* (2013.01); *H01L 27/148* (2013.01); *H01L 27/14643* (2013.01)

(58) Field of Classification Search
CPC ............... H01L 27/14623; H01L 31/02164; H01L 51/4273
USPC ....... 257/184–191, 637, E33.078; 438/57–69
See application file for complete search history.

(56) References Cited

U.S. PATENT DOCUMENTS

| | | | |
|---|---|---|---|
| 5,670,382 A * | 9/1997 | Ishizuya et al. ................. | 438/60 |
| 6,627,506 B2 | 9/2003 | Kuhn et al. | |
| 7,541,212 B2 | 6/2009 | Oh | |
| 8,697,472 B2 | 4/2014 | Weng et al. | |
| 9,059,057 B2 * | 6/2015 | Tsao et al. ..................... | 257/189 |
| 2007/0210395 A1 * | 9/2007 | Maruyama et al. ........... | 257/431 |

FOREIGN PATENT DOCUMENTS

| | | |
|---|---|---|
| CN | 101404288 | 4/2009 |
| CN | 102376732 | 3/2012 |

* cited by examiner

*Primary Examiner* — Calvin Lee
(74) *Attorney, Agent, or Firm* — Hauptman Ham, LLP (57) ABSTRACT

A semiconductor device includes a substrate having a first side and a second side opposite the first side. The substrate has a sensor region proximate the first side. The semiconductor device also includes a first compressive layer over the second side of the substrate. The semiconductor device further includes a light blocking element over the first compressive layer. The semiconductor device additionally includes a second compressive layer over the first compressive layer and covering a portion of the light blocking element. The semiconductor device also includes a third compressive layer between the second compressive layer and the portion of the light blocking element.

20 Claims, 5 Drawing Sheets

SEMICONDUCTOR DEVICE WITH COMPRESSIVE LAYERS

PRIORITY CLAIM

The present application is a continuation of U.S. application Ser. No. 13/492,258, filed Jun. 8, 2012, now U.S. Pat. No. 9,059,057, issued Jun. 16, 2015, which is incorporated herein by reference in its entirety.

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device.

An image sensor device includes a pixel array (or grid) for detecting light and recording an intensity (brightness) of the detected light. The pixel array responds to the light by accumulating a charge—for example, the more light, the higher the charge. The accumulated charge is then used (for example, by other circuitry) to provide a color and brightness for use in a suitable application, such as a digital camera. One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is sufficiently thin so that light projected towards the backside of the substrate can reach the pixel grid. BSI image sensor devices provide a high fill factor and reduced destructive interference, as compared to front-side illuminated (FSI) image sensor devices.

Due to device scaling, improvements to BSI technology are continually being made to further improve image quality of BSI image sensor devices. Although existing BSI image sensor devices and methods of fabricating BSI image sensor devices have been generally adequate for their intended purposes, as device scaling down continues, they have not been entirely satisfactory in all respects.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
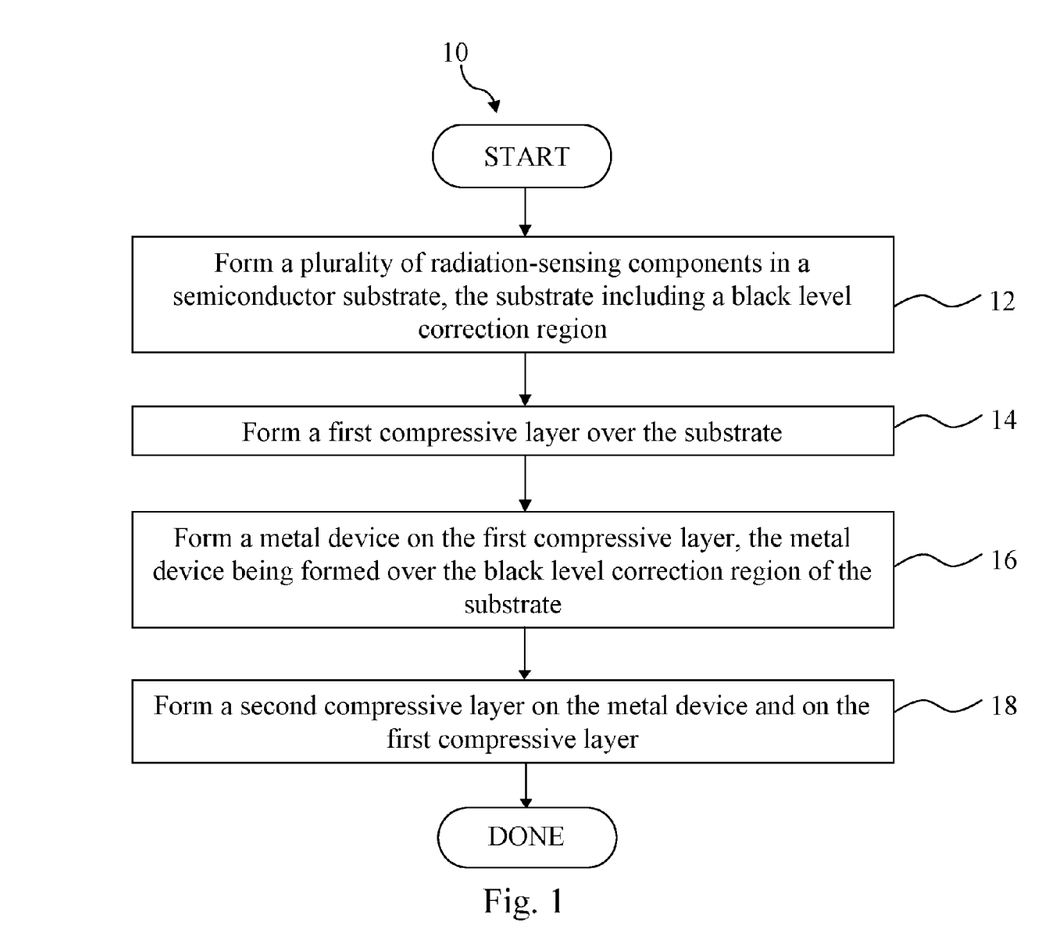
FIG. 1 is a flowchart of a method for fabricating an image sensor device according to various aspects of the present disclosure.

Illustrated in FIG. 1 is a flowchart of a method 10 for fabricating a semiconductor image sensor device according to various aspects of the present disclosure. Referring to FIG. 1, the method 10 begins with block 12 in which a plurality of radiation-sensing components is formed in a semiconductor substrate. The substrate includes a black level correction region. The method 10 continues with block 14, in which a first compressive layer is formed over the substrate. The method 10 continues with block 16 in which a metal device is formed on the first compressive layer. The metal device is formed over the black level correction region of the substrate. The method 10 continues with block 18 in which a second compressive layer is formed on the metal device and on the first compressive layer. It is understood that additional processing steps may be performed before, during, or after the method 10 of FIG. 1. But for the sake of simplicity, these additional processing steps are not discussed in detail herein.

FIGS. 2 to 5 are diagrammatic fragmentary sectional views of an image sensor device 30 at various stages of fabrication according to aspects of the method 10 of FIG. 1. In some embodiments, image sensor device 30 is a back-side illuminated (BSI) image sensor. The image sensor device 30 includes an array or grid of pixels for sensing and recording an intensity of radiation (such as light) directed toward a back-side of the image sensor device 30. The image sensor device 30 may include a charge-coupled device (CCD), complimentary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 5 have been simplified for a better understanding of the inventive concepts of the present disclosure and may not be drawn to scale.

Figure 2:
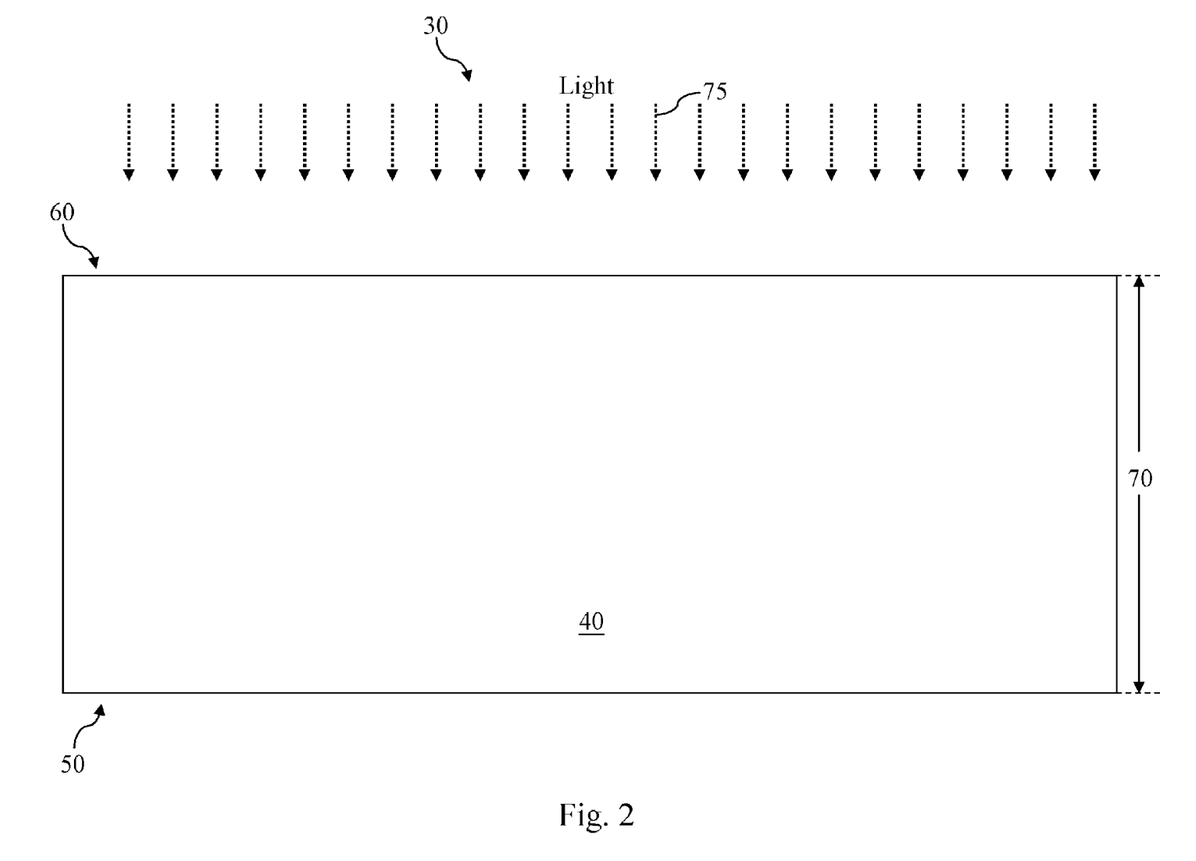
FIGS. 2-5 are diagrammatic fragmentary cross-sectional views of an image sensor device at various stages of fabrication in accordance with various aspects of the present disclosure.

With reference to FIG. 2, the image sensor device 30 includes a substrate 40, hereinafter referred to as a device substrate. The device substrate 40 is a silicon substrate doped with a p-type dopant such as Boron (for example a p-type substrate). Alternatively, the device substrate 40 could be another suitable semiconductor material. For example, the device substrate 40 may be a silicon substrate that is doped with an n-type dopant such as Phosphorous or Arsenic (an n-type substrate). The device substrate 40 could include other elementary semiconductors such as germanium or diamond. The device substrate 40 could optionally include a compound semiconductor and/or an alloy semiconductor. Further, the device substrate 40 could include an epitaxial layer (epi layer). In some embodiments, the device substrate 40 is strained for performance enhancement. In some embodiments, the device substrate 40 includes a silicon-on-insulator (SOI) structure.

Referring back to FIG. 2, the device substrate 40 has a front side (also referred to as a front surface) 50 and a back side (also referred to as a back surface) 60. For a BSI image sensor device, such as the image sensor device 30, radiation is projected toward the back side 60 and enters the substrate 40 through the back surface. The device substrate 40 also has an initial thickness 70. In some embodiments, the initial thickness 70 is in a range from about 100 microns (um) to about 3000 um, for example between about 500 um and about 1000 um.

A plurality of dielectric trench isolation (STI) structures is formed in the substrate 40. In some embodiments, the STI structures are formed by the following process steps: etching openings into the substrate 40 from the front side 50; filling the openings with a dielectric material such as silicon oxide, silicon nitride, silicon oxynitride, a low-k material, or another suitable dielectric material; and thereafter performing a polishing process—for example a chemical mechanical polishing (CMP) process—to planarize the surface of the dielectric material filling the openings. In some embodiments, deep trench isolation (DTI) structures may be formed. The formation processes for the DTI structures may be similar to the STI structures, though the DTI structures are formed to have greater depths than the STI structures. In certain embodiments, doped isolation structures may also be formed. These doped isolation structures may be formed by one or more ion implantation processes. The doped isolation structures may be formed to replace or to supplement the STI or DTI structures.

A plurality of pixels is formed in the substrate 40. The pixels contain radiation-sensing doped regions. These radiation-sensing doped regions are formed by one or more ion implantation processes or diffusion processes and are doped with a doping polarity opposite from that of the substrate 40 (or a doped region 140). Thus, in the embodiment illustrated, the pixels contain n-type doped regions. For a BSI image sensor device such as the image sensor device 30, the pixels are operable to detect radiation, such as an incident light 75, that is projected toward device substrate 40 from the back side 60.

In some embodiments, the pixels each include a photodiode. A deep implant region may be formed below each photodiode in some embodiments. In other embodiments, the pixels may include pinned layer photodiodes, photogates, reset transistors, source follower transistors, and transfer transistors. The pixels may also be referred to as radiation-detection devices or light-sensors. The pixels may be varied from one another to have different junction depths, thicknesses, widths, and so forth. It is understood that each pair of adjacent or neighboring pixels may be separated from each other by a respective one of the isolation structures discussed above. For the sake of simplicity, neither the pixels nor the isolation structures are specifically illustrated herein.

Figure 3:
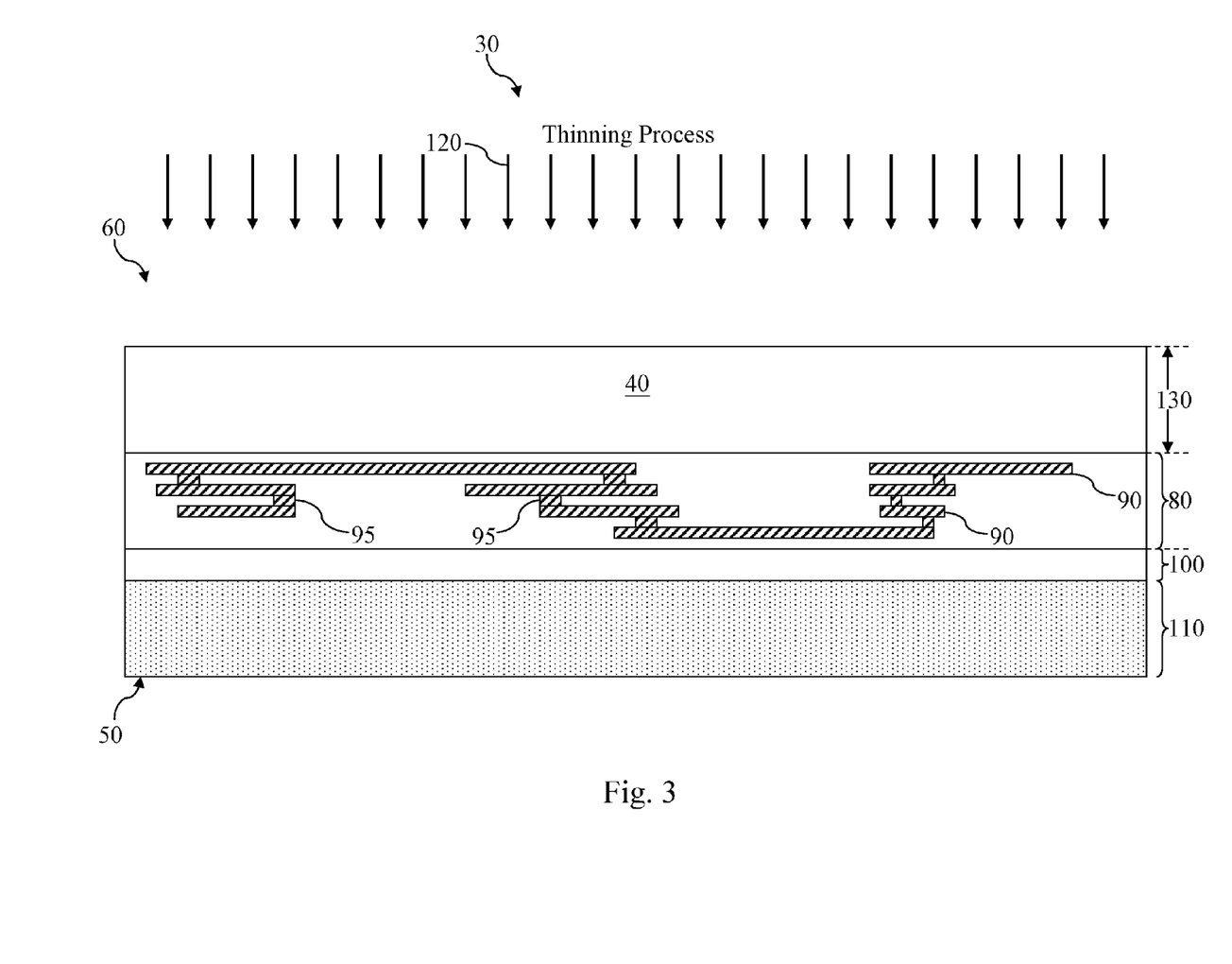

Referring now to FIG. 3, an interconnect structure 80 is formed over the front side 50 of the device substrate 40. The interconnect structure 80 includes a plurality of patterned dielectric layers and conductive layers that provide interconnections (e.g., wiring) between the various doped features, circuitry, and input/output of the image sensor device 30. The interconnect structure 80 includes an interlayer dielectric (ILD) and a multilayer interconnect (MLI) structure. The MLI structure includes contacts, vias and metal lines. For purposes of illustration, a plurality of conductive lines 90 and vias/contacts 95 are shown in FIG. 3. The conductive lines 90 and vias/contacts 95 illustrated are merely exemplary, and the actual positioning and configuration of the conductive lines 90 and vias/contacts 95 may vary depending on design needs and manufacturing concerns.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 95) and horizontal connection (for example, conductive lines 90). Alternatively, a copper multilayer interconnect may be used. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 3, a buffer layer 100 is formed on the interconnect structure 80. In the present embodiment, the buffer layer 100 includes a dielectric material such as silicon oxide. Alternatively, the buffer layer 100 may optionally include silicon nitride. The buffer layer 100 is formed by CVD, PVD, or other suitable techniques. The buffer layer 100 is planarized to form a smooth surface by a CMP process.

Thereafter, a carrier substrate 110 is bonded with the device substrate 40 through the buffer layer 100, so that processing of the back side 60 of the device substrate 40 can be performed. The carrier substrate 110 in the present embodiment is similar to the substrate 40 and includes a silicon material. Alternatively, the carrier substrate 110 may include a glass substrate or another suitable material. The carrier substrate 110 may be bonded to the device substrate 40 by molecular forces—a technique known as direct bonding or fusion bonding—or by other bonding techniques known in the art, such as metal diffusion or anodic bonding.

Referring back to FIG. 3, the buffer layer 100 provides electrical isolation between the device substrate 40 and the carrier substrate 110. The carrier substrate 110 provides protection for various features formed on the front side 50 of the device substrate 40, such as the pixels formed therein. The carrier substrate 110 also provides mechanical strength and support for processing of the back side 60 of the device substrate 40, as discussed below. After bonding, the device substrate 40 and the carrier substrate 110 may optionally be annealed to enhance bonding strength.

Still referring to FIG. 3, after the carrier substrate 110 is bonded, a thinning process 120 is then performed to thin the device substrate 40 from the back side 60. The thinning process 120 may include a mechanical grinding process or a chemical thinning process. A substantial amount of substrate material may be first removed from the device substrate 40 during the mechanical grinding process. Afterwards, the chemical thinning process may apply an etching chemical to the back side 60 of the device substrate 40 to further thin the device substrate 40 to a thickness 130, which is on the order of a few microns. In some embodiments, the thickness 130 is greater than about 1 um but less than about 3 um. It is also understood that the particular thicknesses disclosed in the present disclosure are mere examples and that other thicknesses may be implemented depending on the type of application and design requirements of the image sensor device 30.

Figure 4:
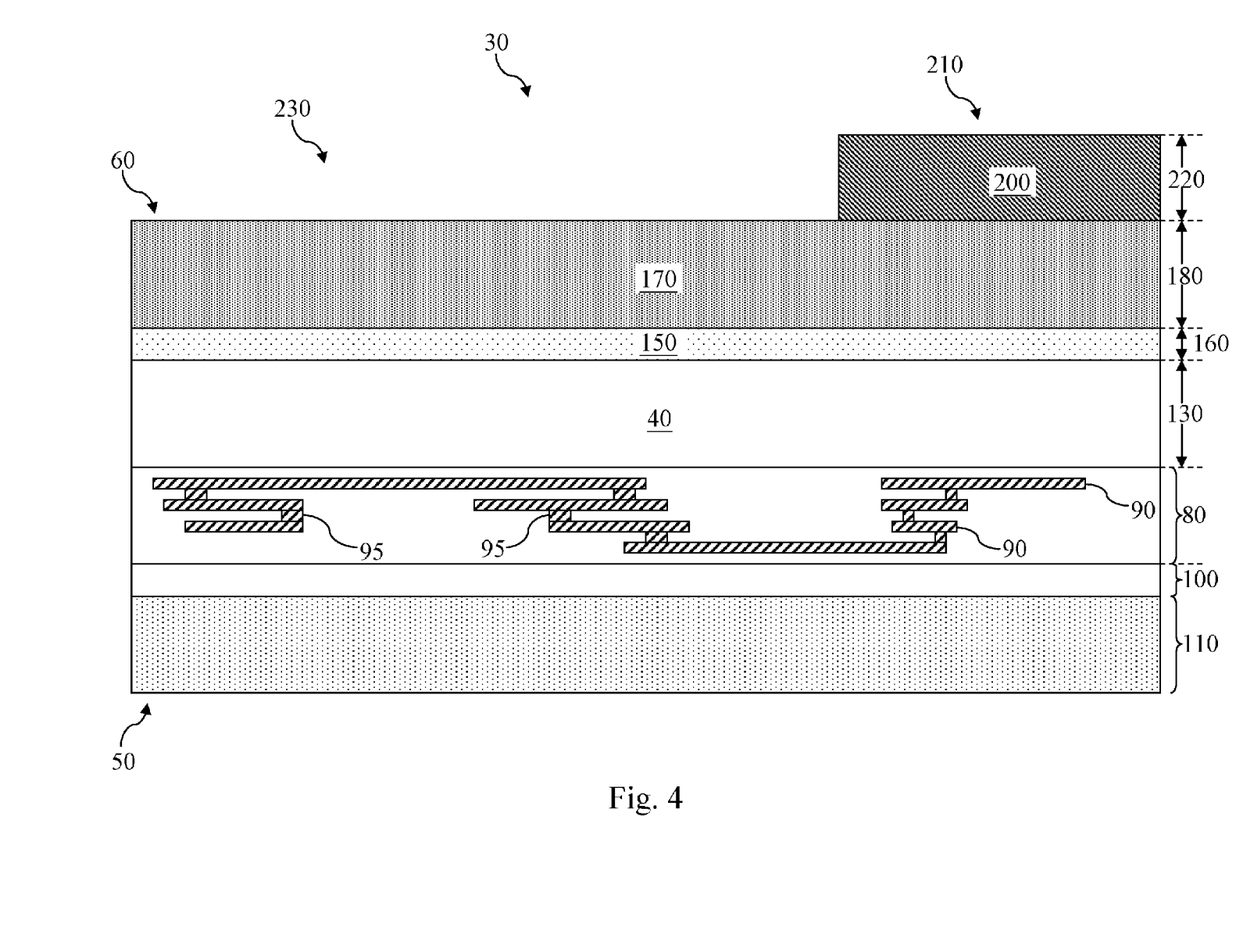

Referring now to FIG. 4, a first compressive layer 150 is formed over the device substrate 40 from the back side 60. The first compressive layer 150 has a thickness 160. In some embodiments, the thickness 160 is less than about 100 Angstroms. In some embodiments, the compressive layer 150 contains silicon oxide. The first compressive layer 150 is operable to deliver a compressive stress to layers above and/or below the first compressive layer. In general, compressive stress is a type of stress on a material that leads to contraction of the material, meaning the length of the material tends to decrease in the compressive direction. Compressive stress is opposite from tensile stress, which is a type of stress on a material that leads to expansion of the material, which means the length of the material tends to increase in the tensile direction. The first compressive layer 150 herein also serves as a buffer layer between the device substrate 40 and the layers to be formed over the substrate 40 from the back side 60.

Next, a second compressive layer 170 is formed over the first compressive layer 150. The second compressive layer 170 also delivers a compressive stress to layers above and/or below the second compressive layer. In one embodiment, the second compressive layer 170 has a thickness 180 of 100 Angstroms. In some embodiments, the thickness 180 is greater than about 100 Angstroms but less than about 1000 Angstroms. In some embodiments, the second compressive layer 170 contains silicon nitride. The silicon nitride material may be tuned to be compressively stressed by adjusting parameters such as a Radio-Frequency (RF) power range and a $SiH_4$ gas content during the formation of the silicon nitride. In certain embodiments, the compressive stress of the compressive film is greater than about $-1 \times 10^9$ dyne/centimeters$^2$ in magnitude. Stated differently, the absolute value of the compressive stress of the compressive film is greater than about $1 \times 10^9$ dyne/centimeters$^2$.

The dual-layer scheme of the first and second compressive layers 150 and 170 in one embodiment of the current disclosure are both negatively charged. In one embodiment, the first compressive layer 150 is formed over the device substrate 40 by plasma oxidation. In contrast to the well-accepted positive charge for thermally grown SiO2, the net oxide charge was negative and a function of the layer thickness. In one embodiment, the second compressive layer 170 is formed over the first compressive layer 150 by plasma-enhanced chemical vapor deposition (PECVD) in strongly diluted silane plasmas. In this embodiment, the negative charge was created due to intentionally oxidation of the silicon surface by plasma species. The net charge was therefore negative under process conditions where plasma oxidation played a major role. Such conditions included low deposition rates and relatively thin grown layers. As a result, the plasma oxidation of the silicon surface results in SiO2 layers with a surplus of oxygen. This surplus of oxygen is able to accumulate a negative charge.

Next, a metal device 200 is formed on a portion of the compressive layer 170. The metal device 200 may be formed using a suitable deposition process and patterning process known in the art. The metal device 200 is formed in a region of the image sensor device 30 known as a black level correction region 210. The black level correction region 210 contains one or more reference pixels formed in the device substrate 40 that need to be kept optically dark. Therefore, the metal device 200 is operable to block light penetration from the back side 60 so that the reference pixel(s) below the metal device (formed in the substrate 40, not illustrated herein) can be kept dark. Thus, the metal device 200 may also be referred to as a metal shield. In some embodiments, the metal device 200 contains AlCu. The metal device 200 has a thickness 220. In some embodiments, the thickness 220 is greater than about 600 Angstroms but less than about 6000 Angstroms. In the embodiments illustrated herein, the metal device 200 is a tensile device.

In addition to the black level correction region 210, the image sensor device 30 also has an array region 230, which contains "regular" pixels that are operable to detect light and should not be kept dark. Also, a color filtering layer can be placed in the array region 230. Thus, no light-blocking devices are formed over the second compressive layer 170 in the array region 230.

Figure 5:
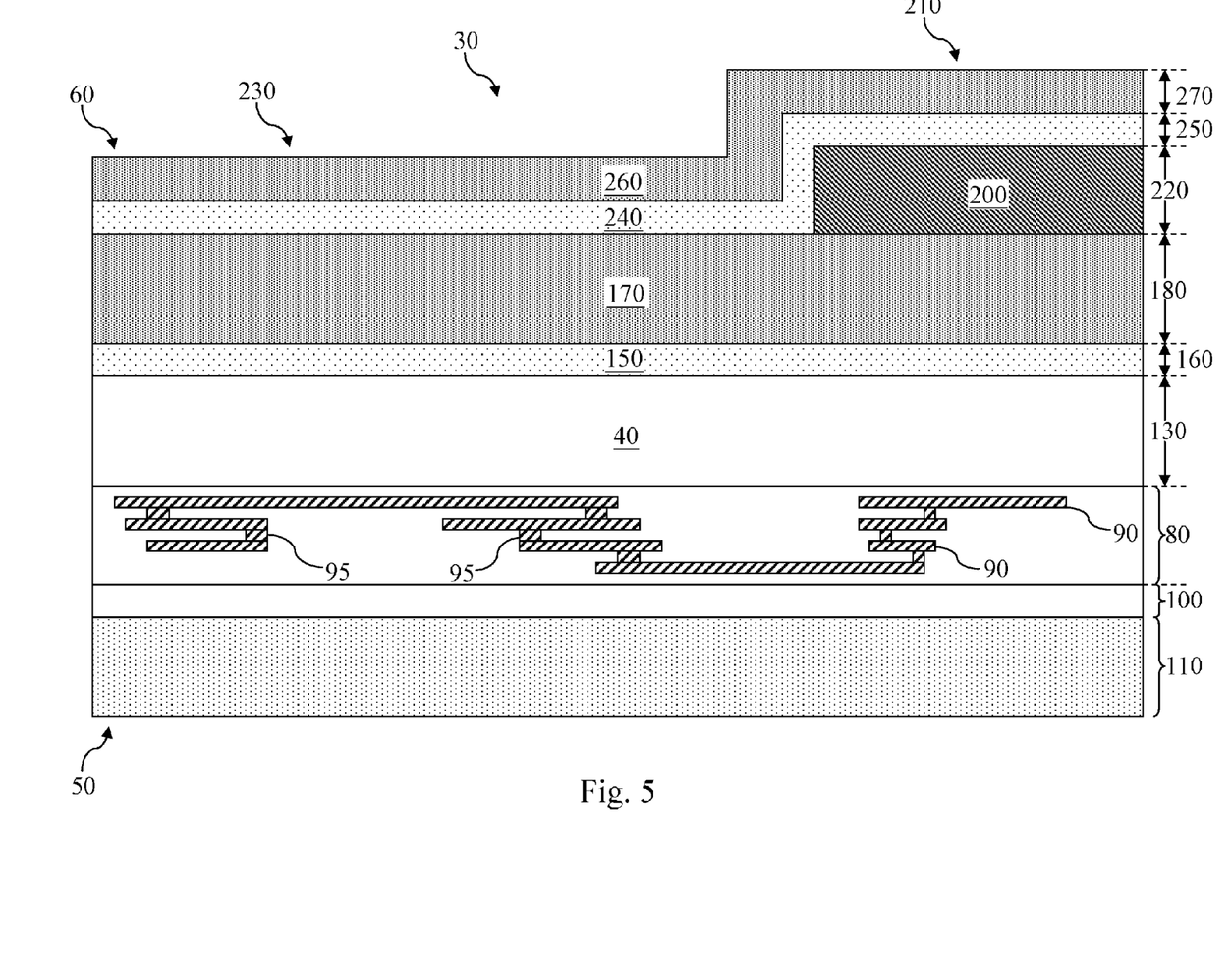

Referring now to FIG. 5, a compressive layer 240 is formed over the metal device 200 and over the exposed surface of the second compressive layer 170. In other words, the compressive layer 240 is formed in both the black level correction region 210 and the array region 230. A sidewall of the metal device 200 is covered by the compressive layer 240. The compressive layer 240 delivers a compressive stress to the metal device 200. The compressive layer 240 has a thickness 250. In some embodiments, the thickness 250 is greater than about 500 Angstroms but less than about 4000 Angstroms. In some embodiments, the compressive layer 250 contains silicon oxide.

Next, a compressive layer 260 is formed over the compressive layer 240. The compressive layer 260 is formed in both the black level correction region 210 and the array region 230. The compressive layer 260 delivers a compressive stress to the layers below compressive layer 260. The compressive layer 260 has a thickness 270. In some embodiments, the thickness 270 is greater than about 500 Angstroms but less than about 3500 Angstroms. In some embodiments, the compressive layer 260 contains silicon nitride. Similar to the second compressive layer 170, the silicon nitride material of the compressive layer 260 may be tuned to be compressively stressed by adjusting parameters such as a Radio-Frequency (RF) power range and a $SiH_4$ gas content during the formation of the silicon nitride. In certain embodiments, the compressive stress of the compressive film is greater than about $-2 \times 10^9$ dyne/centimeters$^2$ in magnitude.

The embodiments discussed above offer advantages over conventional image sensor devices, for example advantages in dark current performances. However, it is understood that not all advantages are necessarily discussed herein, and other embodiments may offer different advantages, and that no particular advantage is required for all embodiments.

Dark current is a common type of image sensor defect and may be defined as the existence of pixel current when no actual illumination is present. In other words, the pixel "detects" light when the pixel is not supposed to. Dark current defects may be caused by stress. In more detail, conventional image sensors may experience excessive amounts of internal stress. The excessive stress may induce a bandgap of a charge carrier to be narrowed, which may result in leakage current. This issue is particularly severe in the black level correction region of an image sensor, where a metal device (blocking the reference pixels) may cause a dominant level of tensile stress. Such tensile stress caused by the metal device is not adequately alleviated by conventional image sensors, and therefore dark current defects often times plague conventional image sensors.

In comparison, the image sensor device 30 discussed above utilized a unique film stacking scheme to reduce the stress of the metal device 200 in the black level region 210. For example, the nitride-containing second compressive layer 170 is formed below the metal device 200 according to various embodiments. As discussed above, compressive stress and tensile stress are opposite one another. The second compressive layer 170 delivers a compressive stress to the metal device 200 above the second compressive layer, thereby reducing the tensile stress of the metal device 200. In addition, the amount of stress delivered by a layer to another layer depends on the relative thicknesses of these layers. Here, the metal device 200 is somewhat thick (e.g., being thousands of Angstroms thick). Thus, to ensure a sufficient amount of compressive stress can be delivered to the metal device 200, the nitride-containing second compressive layer 170 is configured to have a relatively large thickness (e.g., being thousands of Angstroms thick).

Conventional image sensors also fail to protect the sidewalls of the metal devices in the black level region. The lack of sidewall protection of the metal device also leads to leakage current that can degrade the performance of the image sensor. In comparison, the image sensor device 30 discussed according to various embodiments above utilizes the oxide-containing compressive layer 240 to protect the sidewall of the metal device 200. Such sidewall protection reduces the current leakage defects and improves the dark current performance of the image sensor device 200. Moreover, the oxide-containing compressive layer 240 is also configured to deliver a compressive stress to the metal device 200, thereby further reducing the tensile stress of the metal device 200. Once again, to ensure that a sufficient amount of compressive stress can be delivered to the metal device 200, the compressive layer 240 is also designed to have be relatively thick, for example being thousands of Angstroms thick.

It is understood that the first compressive layer 150 and the compressive layer 260 are also operable to deliver compressive stress to the metal device 200, even though the compressive layers 150 and 260 are not in direct physical contact with the metal device 200. Through the compressive layers 150, 170, 240, and 260, the total amount of compressive stress delivered to the metal device 200 can substantially balance the tensile stress of the metal device 200. Stated differently, the metal device 200 may approach a stress-free state. As such, the energy bandgap will not be substantially altered, thereby reducing leakage current and improving dark current performance.

Furthermore, negatively charged compressive backside anti-reflective layers result in improved DC performance. Specifically, when the compressive backside anti-reflective layers are negatively charged, it reduces DC significantly thereby improving dark current.

Additional fabrication processes may be performed to complete the fabrication of the image sensor device 30. For example, a color filter layer may be formed on the back side 60 of the substrate 40. The color filter layer may contain a plurality of color filters that may be positioned such that the incoming radiation is directed thereon and therethrough. The color filters may include a dye-based (or pigment based) polymer or resin for filtering a specific wavelength band of the incoming radiation, which corresponds to a color spectrum (e.g., red, green, and blue). Thereafter, a micro-lens layer containing a plurality of micro-lenses is formed over the color filter layer. The micro-lenses direct and focus the incoming radiation toward specific radiation-sensing regions in the device substrate 40. The micro-lenses may be positioned in various arrangements and have various shapes depending on a refractive index of a material used for the micro-lens and distance from a sensor surface. The device substrate 40 may also undergo an optional laser annealing process before the forming of the color filter layer or the micro-lens layer. For reasons of simplicity, the color filters and the micro-lenses are not specifically illustrated herein.

It is understood that the sequence of the fabrication processes described above is not intended to be limiting. Some of the layers or devices may be formed according to different processing sequences in other embodiments than what is shown herein. Furthermore, some other layers may be formed but are not illustrated herein for the sake of simplicity. For example, an anti-reflection coating (ARC) layer may be formed over the back side 60 of the substrate 40 before the formation of the color filter layer and/or the micro-lens layer.

It is also understood that the discussions above pertain mostly to a pixel region of the image sensor device 30. In addition to the pixel region, the image sensor 30 also includes a periphery region, a bonding pad region, and a scribe line region. The periphery region may include digital devices, such as application-specific integrated circuit (ASIC) devices or system-on-chip (SOC) devices, or other reference pixels used to establish a baseline of an intensity of light for the image sensor device 30. The bonding pad region is used for the formation of bonding pads, so that electrical connections between the image sensor device 30 and external devices may be established. The scribe line region includes a region that separates one semiconductor die from an adjacent semiconductor die. The scribe line region is cut therethrough in a later fabrication process to separate adjacent dies before the dies are packaged and sold as integrated circuit chips. For the sake of simplicity, the details of these other regions of the image sensor device 30 are not illustrated or described herein.

An aspect of this description is related to a semiconductor device. The semiconductor device comprises a substrate having a first side and a second side opposite the first side. The substrate has a sensor region proximate the first side. The semiconductor device also comprises a first compressive layer over the second side of the substrate. The semiconductor device further comprises a light blocking element over the first compressive layer. The semiconductor device additionally comprises a second compressive layer over the first compressive layer and covering a portion of the light blocking element. The semiconductor device also comprises a third compressive layer between the second compressive layer and the portion of the light blocking element.

Another aspect of this description is related to an image sensor. The image sensor comprises a semiconductor substrate having a front side and a back side. The substrate comprises a sensor region and a black level correction region proximate the front side. The image sensor also comprises a first compressively-stressed layer over the back side of the substrate. The image sensor further comprises a light blocking element over the first compressively-stressed layer and over at least a portion of the black level correction region. The image sensor additionally comprises second compressively-stressed layer over at least a portion of the light blocking element and over the first compressively-stressed layer. The image sensor also comprises a third compressively-stressed layer over the second compressively-stressed layer and over the light blocking element. The second compressively-stressed layer is between the third compressively-stressed layer and the light blocking element.

A further aspect of this description is related to a semiconductor device. The semiconductor device comprises comprising a substrate having a first side, a second side opposite the first side, and sensor regions proximate the first side. The semiconductor device also comprises a first compressive layer over the second side of the substrate. The semiconductor device further comprises a light blocking device over the first compressive layer. The light blocking device is configured to exert a tensile stress on the substrate. The semiconductor device additionally comprises a second compressive layer over the light blocking device. The second compressive layer covers a top surface of the light blocking device. The semiconductor device also comprises a third compressive layer between the second compressive layer and the light blocking device. The third compressive layer covers the top surface of the light blocking device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a substrate having a first side and a second side opposite the first side, the substrate having a sensor region proximate the first side;
   a first compressive layer over the second side of the substrate;
   a light blocking element over the first compressive layer;
   a second compressive layer over the first compressive layer and covering a portion of the light blocking element; and
   a third compressive layer between the second compressive layer and the portion of the light blocking element.

2. The semiconductor device of claim 1, wherein the first compressive layer comprises silicon oxide.

3. The semiconductor device of claim 1, wherein the first compressive layer comprises silicon nitride.

4. The semiconductor device of claim 1, wherein the first compressive layer has a thickness ranging from about 10 Angstroms to about 100 Angstroms.

5. The semiconductor device of claim 1, wherein the second compressive layer has a thickness ranging from about 100 Angstroms to about 1000 Angstroms.

6. The semiconductor device of claim 1, wherein the light blocking element is at least partially positioned over a black level correction region of the substrate, and the black level correction region includes at least one reference pixel.

7. The semiconductor device of claim 1, wherein:
   the first compressive layer is configured to exert a stress on the substrate or on the third compressive layer greater than about $-1\times10^9$ dyne/centimeter$^2$ in magnitude; and
   the second compressive layer is configured to exert a stress on the third compressive layer greater than about $-2\times10^9$ dyne/centimeter$^2$ in magnitude.

8. The semiconductor device of claim 1, wherein the light blocking element is a metal device.

9. The semiconductor device of claim 8, wherein the metal device is configured to exert a tensile stress on the substrate.

10. An image sensor, comprising:
    a semiconductor substrate having a front side and a back side, the substrate including a sensor region and a black level correction region proximate the front side;
    a first compressively-stressed layer over the back side of the substrate;
    a light blocking element over the first compressively-stressed layer and over at least a portion of the black level correction region;
    a second compressively-stressed layer over at least a portion of the light blocking element and over the first compressively-stressed layer; and
    a third compressively-stressed layer over the second compressively-stressed layer and over the light blocking element, the second compressively-stressed layer being between the third compressively-stressed layer and the light blocking element.

11. The image sensor of claim 10, wherein the black level correction region comprises radiation-sensitive pixels, and the radiation-sensitive pixels are configured to detect light that enters the substrate from the back side.

12. The image sensor of claim 10, wherein the light blocking element is configured to exert a tensile stress on the substrate.

13. The image sensor of claim 10, wherein:
    the first compressively-stressed layer is configured to exert a stress on the light blocking element greater than about $-1\times10^9$ dyne/centimeter$^2$ in magnitude; and
    the second compressively-stressed layer is configured to exert a stress on the light blocking element greater than about $-2\times10^9$ dyne/centimeter$^2$ in magnitude.

14. The image sensor of claim 10, wherein the light blocking element comprises a metal material.

15. A semiconductor device, comprising:
    a substrate having a first side, a second side opposite the first side, and sensor regions proximate the first side;
    a first compressive layer over the second side of the substrate;
    a light blocking device over the first compressive layer, wherein the light blocking device is configured to exert a tensile stress on the substrate;
    a second compressive layer over the light blocking device, wherein the second compressive layer covers a top surface of the light blocking device; and
    a third compressive layer between the second compressive layer and the light blocking device, wherein the third compressive layer covers the top surface of the light blocking device.

16. The semiconductor device of claim 15, wherein:
    the first compressive layer is configured to exert a stress on the light blocking device greater than about $-1\times10^9$ dyne/centimeter$^2$ in magnitude.

17. The semiconductor device of claim 15, wherein the first compressive layer is negatively charged.

18. The semiconductor device of claim 15, wherein the third compressive layer has a thickness ranging from about 500 Angstroms to about 4,000 Angstroms.

19. The semiconductor device of claim 15, wherein the substrate further comprises a black level correction region having at least one reference pixel, and the light blocking device is at least partially positioned over a portion of the black level correction region.

20. The semiconductor device of claim 19, wherein the light blocking device is configured to prevent light from being communicated to the black level correction region.

* * * * *